(12) United States Patent
Nam

(10) Patent No.: US 8,760,336 B2
(45) Date of Patent: Jun. 24, 2014

(54) MIXED MODE ANALOG TO DIGITAL CONVERTER AND METHOD OF OPERATING THE SAME

(71) Applicant: Electronics and Telecommunications Research Institute, Daejeon (KR)

(72) Inventor: Jaewon Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/716,063

(22) Filed: Dec. 14, 2012

(65) Prior Publication Data

US 2014/0015702 A1   Jan. 16, 2014

(30) Foreign Application Priority Data

Jul. 11, 2012  (KR) .................. 10-2012-0075614

(51) Int. Cl.
*H03M 1/12*      (2006.01)
*H03M 1/14*      (2006.01)

(52) U.S. Cl.
CPC .............. *H03M 1/144* (2013.01); *H03M 1/123* (2013.01)
USPC ......................................... 341/156; 341/155

(58) Field of Classification Search
CPC .............................. H03M 1/144; H03M 1/123
USPC .......................... 341/118, 156, 159
See application file for complete search history.

(56) References Cited

U.S. PATENT DOCUMENTS

| | | | |
|---|---|---|---|
| 5,936,566 A * | 8/1999 | Park | 341/159 |
| 7,038,609 B1 | 5/2006 | Hurrell | |
| 7,205,922 B2 * | 4/2007 | Lee | 341/158 |
| 8,134,487 B2 * | 3/2012 | Harpe | 341/163 |
| 8,310,388 B2 * | 11/2012 | Chang et al. | 341/156 |
| 8,570,204 B2 * | 10/2013 | Bae et al. | 341/158 |
| 2003/0016149 A1 * | 1/2003 | Choksi | 341/118 |

FOREIGN PATENT DOCUMENTS

| | | |
|---|---|---|
| KR | 10-2011-0108563 A | 10/2011 |
| KR | 10-2012-0060280 A | 6/2012 |

OTHER PUBLICATIONS

Ba Ro Saim Sung et al., "A Time-Interleaved Flash—SAR Architecture for High Speed A/D Conversion", 2009, pp. 984-987, IEEE.

* cited by examiner

*Primary Examiner* — Brian Young

(57) ABSTRACT

An analog to digital converter in accordance with the inventive concept may include a reference voltage generation circuit outputting first and second reference voltages; a decompression part decompressing amplitude of an analog input signal and the first and second reference voltages; a flash ADC converting the decompressed analog input signal into a first digital signal with reference to the decompressed first and second reference voltages; and a successive approximation ADC converting the analog input signal into a second digital signal according to a successive approximation operation with reference to the first digital signal and the first and second reference voltages.

13 Claims, 5 Drawing Sheets

MIXED MODE ANALOG TO DIGITAL CONVERTER AND METHOD OF OPERATING THE SAME

CROSS-REFERENCE TO RELATED APPLICATIONS

This U.S. non-provisional patent application claims priority under 35 U.S.C. §119 of Korean Patent Application No. 10-2012-0075614, filed on Jul. 11, 2012, the entire contents of which are hereby incorporated by reference.

BACKGROUND

The present inventive concept herein relates to mixed mode analog to digital converter, and more particularly, to a mixed mode analog to digital converter including a decompression part and a method of operating the same.

As the use of mixed mode system increases, the necessity of an analog to digital converter (ADC) is gradually being increased. In particular, the study on a digital video disk player (DVDP) or a direct broadcasting for satellite receiver (DBSR) is actively being performed and a design technology that can directly process a radio frequency signal (RF) is being emphasized as the biggest issue.

Various types of ADCs have been suggested. A flash ADC, a pipeline ADC and a successive approximation ADC are used in proper application fields according to their characteristics. The flash ADC has an advantage of a high speed operation characteristic and a disadvantage of high power consumption. The successive approximation ADC has advantages of low power consumption and a simple circuit constitution and a disadvantage of a low speed operation characteristic. The pipeline ADC has a medium speed as compared with the flash ADC and the successive approximation ADC. To make up for disadvantages of the above ADCs, the study on a mixed mode ADC (a hybrid ADC) is being performed.

SUMMARY

Embodiments of the inventive concept provide an analog to digital converter. The analog to digital converter may include a reference voltage generation circuit outputting first and second reference voltages; a decompression part decompressing amplitude of an analog input signal and the first and second reference voltages; a flash ADC converting the decompressed analog input signal into a first digital signal with reference to the decompressed first and second reference voltages; and a successive approximation ADC converting the analog input signal into a second digital signal according to a successive approximation operation with reference to the first digital signal and the first and second reference voltages.

Embodiments of the inventive concept also provide an operation method of analog to digital converter. The operation method of analog to digital conversion may include decompressing voltage amplitude of an analog input signal and a reference voltage; generating a first digital signal constituted by first bits by a flash ADC with reference to the decompressed analog input signal and the decompressed reference voltage; generating a second digital signal constituted by second bits on the basis of the first bits by a successive approximation ADC; and generating the first and second digital signals as a final digital output signal by a digital correction circuit.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
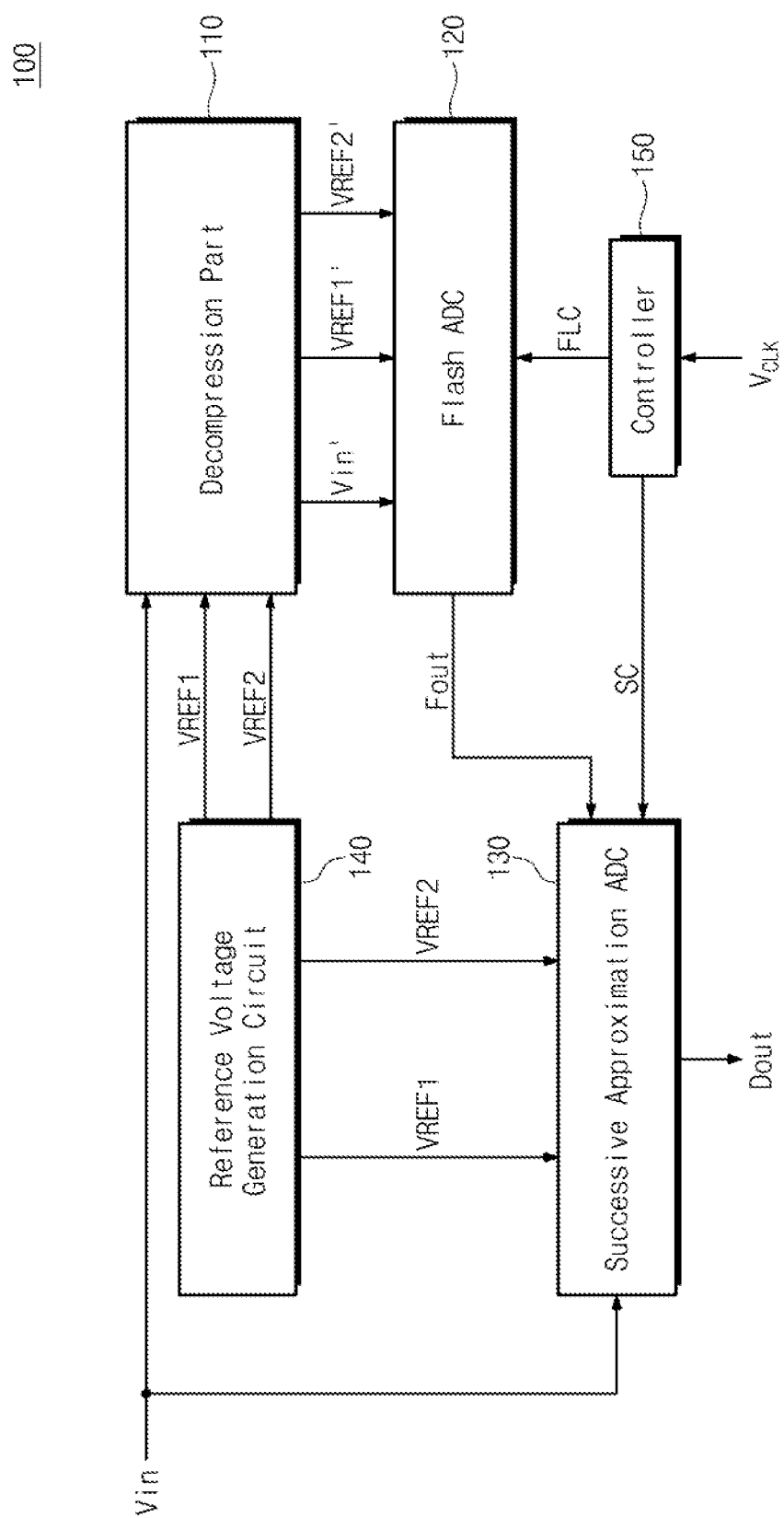
FIG. 1 is a block diagram illustrating a mixed mode analog to digital converter in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram illustrating a mixed mode analog to digital converter in accordance with some embodiments of the inventive concept. Referring to FIG. 1, the mixed mode analog to digital converter 100 includes a decompression part 110, a flash ADC 120, a successive approximation ADC 130, a reference voltage generation circuit 140 and a controller 150.

The decompression part 110 receives first and second reference voltages VREF1 and VREF2 applied from an analog input signal Vin and a reference voltage generation circuit 140. The decompression part 110 decompresses the analog input signal Vin and the first and second reference voltages VREF1 and VREF2 by the magnitude of $RSCALE^{-1}$ to apply the decompressed signals to the flash ADC 120. Since the flash ADC 120 receives the decompressed signals, degradation of the linearity with respect to input signals of high amplitude may be prevented. Generally, if input signals are applied to the flash ADC 120, a sampling device (not illustrated) of the flash ADC 120 receives the input signals. A threshold voltage of transistor of the sampling device varies depending on amplitude of the input signal and thereby the linearity of output signal being output from the sampling device is degraded.

The flash ADC 120 is electrically connected to the decompression part 110, the successive approximation ADC 130 and the controller 150. The flash ADC 120 operates in response to a flash control signal FLC received from the controller 150. The flash ADC 120 receives an analog input signal Vin' decompressed by the magnitude of $RSCALE^{-1}$ in the decompression part 110. The flash ADC 120 receives first and second reference voltages VREF1' and VERF2' decompressed by the magnitude of $RSCALE^{-1}$ in the decompression part 110. The flash ADC 120 generates a flash output signal Fout using the decompressed analog input signal Vin' and the first and second reference voltages VREF1' and VERF2'. The flash output signal Fout may be a digital signal of M bits. The flash ADC 120 compares the decompressed analog input signal Vin' with voltages having different voltage levels at the same time to generate a digital signal at one time.

The successive approximation ADC 130 is electrically connected to the flash ADC 120, the reference voltage generation circuit 140 and the controller 150. The successive approximation ADC 130 operates in response to a successive approximation control signal SC received from the controller 150. The successive approximation ADC 130 is configured to convert an analog input signal Vin received from the outside into a digital signal. The successive approximation ADC 130 receives a flash output signal Fout from the flash ADC 120. The successive approximation ADC 130 converts an analog input signal Vin received from the outside into a digital signal with reference to the flash output signal Fout. The successive approximation ADC 130 converts the received analog input signal Vin into a digital signal of N bits. At this time, the first and second reference voltages VREF1 and VREF2 are used. The successive approximation ADC 130 generates a digital output signal Dout. The digital output signal Dout includes a digital signal Dn converted in the successive approximation ADC 130 and the flash output signal Fout. The digital output signal Dout may include the flash output signal Fout constituted by M bits determined in the flash ADC 120 and the digital signal Dn constituted by N bits determined in the successive approximation ADC 130.

The reference voltage generation circuit 140 is electrically connected to the decompression part 110 and the successive approximation ADC 130. The reference voltage generation circuit 140 provides the first and second reference voltages VREF1 and VREF2 to the decompression part 110 and the successive approximation ADC 130. Although not illustrated in FIG. 1, the reference voltage generation circuit 140 receives a power supply voltage (not shown) from the outside. The reference voltage generation circuit 140 can generate the first and second reference voltages VREF1 and VREF2 using the power supply voltage received from the outside.

The controller 150 is electrically connected to the flash ADC 120 and the successive approximation ADC 130. The controller 150 wholly controls the mixed mode analog to digital converter 100. The controller 150 receives an external clock signal $V_{CLK}$ from the outside. The controller 150 generates the flash control signal FLC and the successive approximation control signal SC using the external clock signal $V_{CLK}$.

According to some embodiments of the inventive concept, the mixed mode analog to digital converter 100 converts the analog input signal Vin into a digital signal of K bits. The flash ADC 120 determines values of high-order M bits among the K bits. The successive approximation ADC 130 determines values of low-order N bits among the K bits on the basis of the high-order M bits determined in the flash ADC 120.

Figure 2:
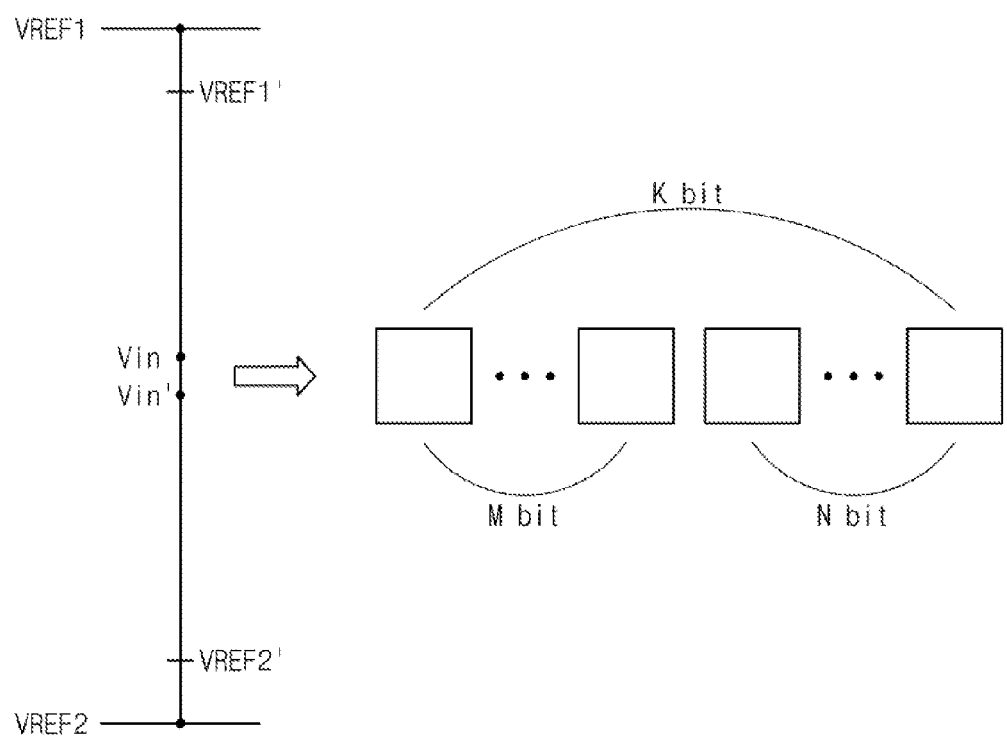
FIG. 2 illustrates that an analog input signal of FIG. 1 is converted into a digital signal of K bits.

FIG. 2 illustrates that an analog input signal of FIG. 1 is converted into a digital signal of K bits. Referring to FIG. 2, the K bits are constituted by high-order M bits and low-order N bits. The high-order M bits are determined in the flash ADC 120 by the decompressed analog input signal Vin' and the decompressed first and second reference voltages VREF1' and VREF2'. The low-order N bits are determined in the successive approximation ADC 130 by the analog input signal Vin and the first and second reference voltages VREF1 and VREF2.

Figure 3:
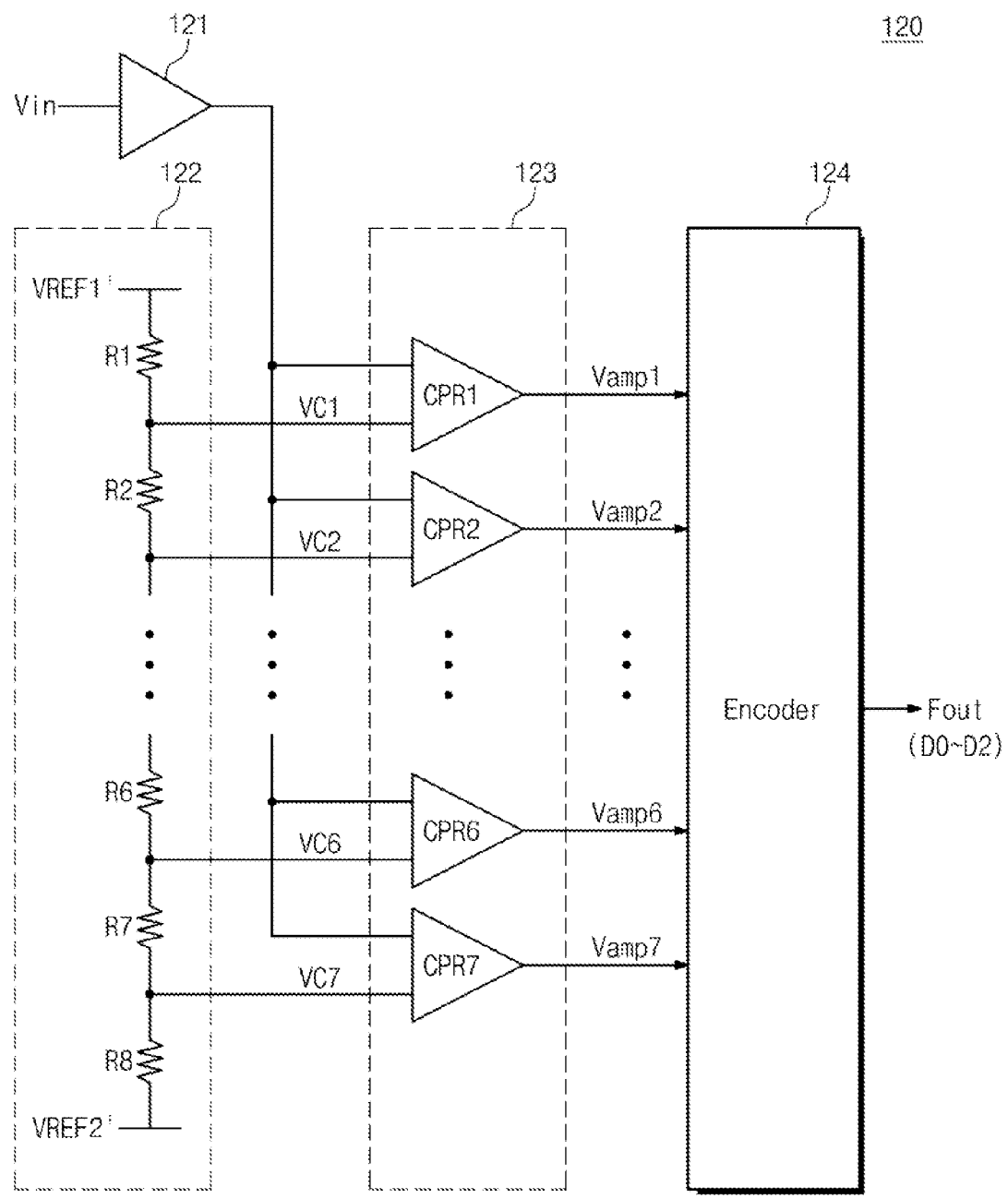
FIG. 3 is a block diagram illustrating a flash ADC of FIG. 1.

FIG. 3 is a block diagram illustrating a flash ADC of FIG. 1. For convenience of description, in FIG. 3, the flash ADC 120 is illustrated which is configured to convert the analog input signal Vin into a digital signal of 3 bits. Referring to FIG. 3, the flash ADC 120 includes a gain amplifier 121, a comparison voltage generation part 122, an amplification part 123 and an encoder 124.

The gain amplifier 121 receives the analog input signal Vin and decompresses the received analog input signal Vin by the magnitude of $RSCALE^{-1}$. The gain amplifier 121 provides the decompressed analog input signal Vin' to a plurality of comparison units CPR1~CPR7 of the amplification part 123.

The comparison voltage generation part 122 includes a plurality of resistors R1~R8. The comparison voltage generation part 122 controls the first and second reference voltages VREF1 and VREF2 to the form of being decompressed by the magnitude of $RSCALE^{-1}$. The comparison voltage generation part 122 generates a plurality of comparison voltages VC1~VC7 using the first and second reference voltages VREF1' and VREF2' decompressed by the magnitude of $RSCALE^{-1}$. The comparison voltage generation part 122 provides the plurality of comparison voltages VC1~VC7 to the amplification part 123.

The $RSCALE^{-1}$ means the decompressed magnitude of the analog input signal Vin and the first and second reference voltages VREF1 and VREF2.

The amplification part 123 includes a plurality of comparison units CPR1~CPR7. The plurality of comparison units CPR1~CPR7 receives the comparison voltages VC1~VC7 from the comparison voltage generation part 122 respectively. The plurality of comparison units CPR1~CPR7 receives an analog input signal Vin' decompressed by the magnitude of $RSCALE^{-1}$. Each of the plurality of comparison units CPR1~CPR7 outputs an amplification signal that a level difference between the decompressed analog input signal Vin' and a comparison voltage received to each comparison unit is amplified. That is, the plurality of comparison units CPR1~CPR7 outputs a plurality of amplification signals Vamp1~Vamp7 respectively.

The encoder 124 is electrically connected to the amplification part 123 and receives a plurality of amplification signals Vamp1~Vamp7. The encoder 124 generates a flash output signal Fout (D0-D2) constituted by high-order M bits on the basis of the plurality of amplification signals Vamp1~Vamp7.

0th through second bits (D0-D2) which are high-order 3 bits are determined in the flash ADC 120. The flash ADC 120 generates first through seventh comparison voltages VC1~VC7 using the decompressed first and second reference voltages VREF1' and VREF2'. The flash ADC 120 receives the flash control signal FLC. The flash ADC 120 compares the first through seventh comparison voltages VC1~VC7 with the decompressed analog input voltage Vin' in response to the flash control signal FLC. According to a comparison result, the flash ADC 120 outputs the flash output signal Fout (D0-D2) which is a digital signal of 3 bits. Assume that the 0th through second bits (D0-D2) converted in the flash ADC 120 are a logic value "0", a logic value "1" and a logic value "1" respectively. In this case, logic values of the first through fourth amplification signals Vamp1~Vamp4 output from the plurality of comparison units CR1~CR7 are respectively "0" and logic values of the fifth through seventh amplification signals Vamp5~Vamp7 output from the plurality of comparison units CR1~CR7 are respectively "1". The encoder 124 outputs 0th through second bits (D0-D2) on the basis of the fourth amplification signal Vamp4 of logic value "0" and the fifth amplification signal Vamp5 of the logic value "1". At this time, the fourth and fifth comparison voltages VC4 and VC5 are used as a reference voltage. The encoder 124 generates the flash output signal Fout (D0-D2) constituted by high-order 3 bits on the basis of the two amplification signals in which the logic value output from the plurality of comparison units CR1~CR7 changes from "0" to "1".

Figure 4:
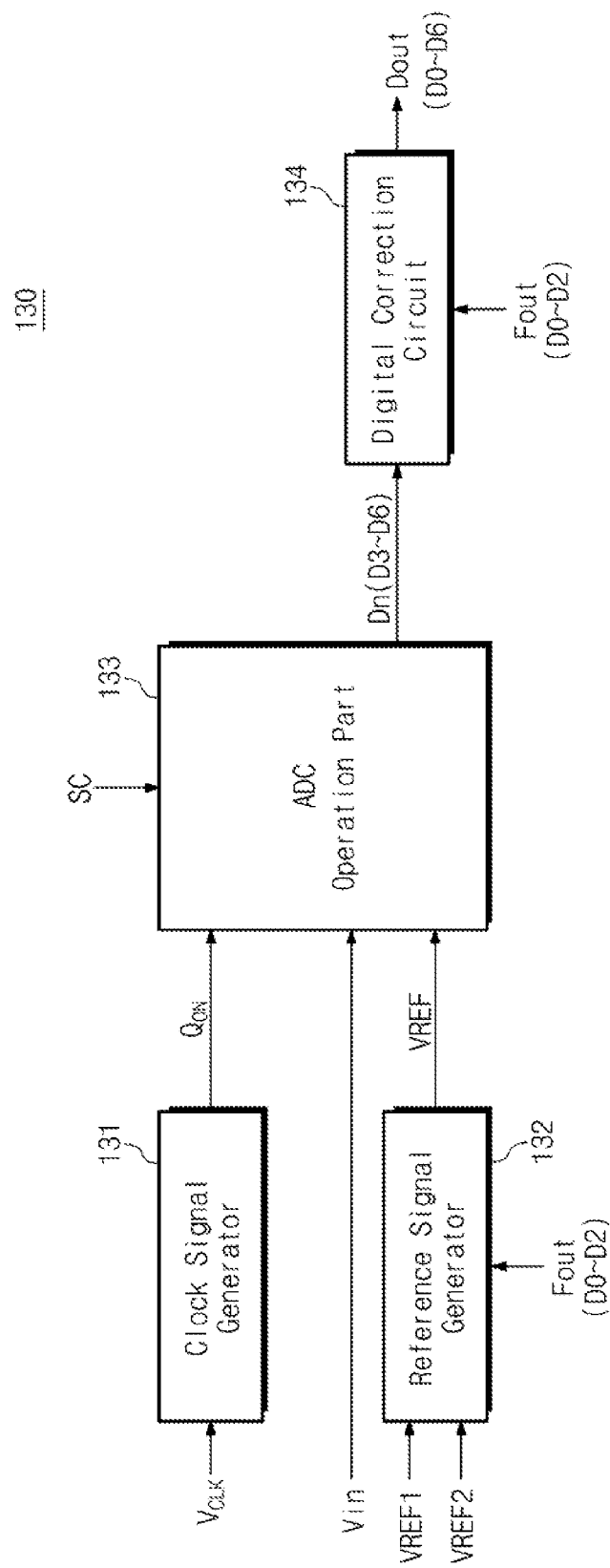
FIG. 4 is a block diagram illustrating a successive approximation ADC of FIG. 1.

FIG. 4 is a block diagram illustrating a successive approximation ADC of FIG. 1. Referring to FIG. 4, the successive approximation ADC 130 includes a clock signal generator 131, a reference signal generator 132, an ADC operation part 133 and a digital correction circuit 134.

The clock signal generator 131 receives an external clock signal $V_{CLK}$ for system conversion to generate a clock signal $Q_{ON}$ in response to the external clock signal $VC_{LK}$. The clock signal generator 131 applies the generated clock signal $Q_{ON}$ to the ADC operation part 133 to perform an operation.

The reference signal generator 132 receives the flash output voltage Fout (D0-D2). The reference signal generator 132 receives the first and second reference voltages VREF1 and VREF2 from the reference voltage generation circuit 140. The reference signal generator 132 generates a plurality of comparison voltage sections using the first and second reference voltages VREF1 and VREF2. The plurality of comparison voltage sections is a reference signal which is not decompressed through the decompression part 110. The successive approximation ADC 130 receives the analog input signal Vin which is not decompressed. The reference signal generator 132 generates a new reference signal VREF to be applied to the successive approximation ADC 130 on the basis of the flash output signal Fout (D0-D2). As described above, 0th through second bits (D0-D2) converted in the flash ADC 120 are output to be a logic value "0", a logic value "1" and a logic value "1" respectively on the basis of the fourth and fifth comparison voltages VC4 and VC5. The reference signal generator 132 generates first and second comparison voltage sections corresponding to the fourth and fifth comparison voltages VC4 and VC5 with reference to the fourth and fifth comparison voltages VC4 and VC5 and using the first and second reference voltages VREF1 and VREF2. The reference signal generator 132 sets an intermediate value of the first and second comparison voltage sections to be the new reference signal VREF to apply it to the successive approximation ADC 130.

Unlike the flash ADC 120, the successive approximation ADC 130 has one comparator. Thus, the successive approximation ADC 130 repeatedly performs an operation while converting the reference signal VREF whenever a digital signal is output. The reference signal generator 132 compares the analog input signal Vin with the reference signal VREF generated on the basis of the flash output signal Fout (D0-D2). Through the aforementioned two comparison voltage sections, if the analog input signal Vin is greater than the reference signal VREF, the first comparison voltage section of a logic value "0" is selected as a next reference signal. If the analog input signal Vin is smaller than the reference signal VREF, the second comparison voltage section of a logic value "1" is selected as a next reference signal. That operation is sequentially performed until an operation that the successive approximation ADC 130 generates low-order 4 bits is finished.

The ADC operation part 133 receives the clock signal $Q_{ON}$, the analog input signal Vin, the reference signal VREF and the successive approximation control signal SC. With reference to the high-order 3 bits output from the flash ADC 120, the ADC operation part 133 generates digital signal Dn (D3-D6) in response to the successive approximation control signal SC. The ADC operation part 133 outputs the generated low-order 4 bits Dn (D3-D6) to the digital correction circuit 134. The ADC operation part 133 operates in an asynchronous mode to reduce power consumption. In the low-order 4 bits, logic values of the most significant bit (MSB) through the least significant bit (LSB) are sequentially determined by a successive approximation operation.

The digital correction circuit 134 corrects digital errors of the high-order 3 bits output from the flash ADC 120 and low-order 4 bits output from the successive approximation ADC 130. The digital output signal Dout may be constituted by the number of bits less than 7 bits (D0-D6). The digital correction circuit 134 corrects digital errors of the received 0th through sixth bits (D0-D6). The digital correction circuit 134 corrects a digital error to generate the digital output signal Dout. Digital errors may be included in the 0th through sixth bits (D0-D6) and the digital correction circuit 134 may output the digital output signal Dout (D0-D6) not including errors.

The successive approximation ADC 130 generates low-order N bits on the basis of the flash output signal Fout (D0-D2). The successive approximation ADC 130 operates in an asynchronous mode. The successive approximation ADC 130 operates a preprocessing amplifier (not shown) occupying most of the power consumption of analog to digital converter only during a defined conversion time and thereby power consumption may be reduced.

Figure 5:
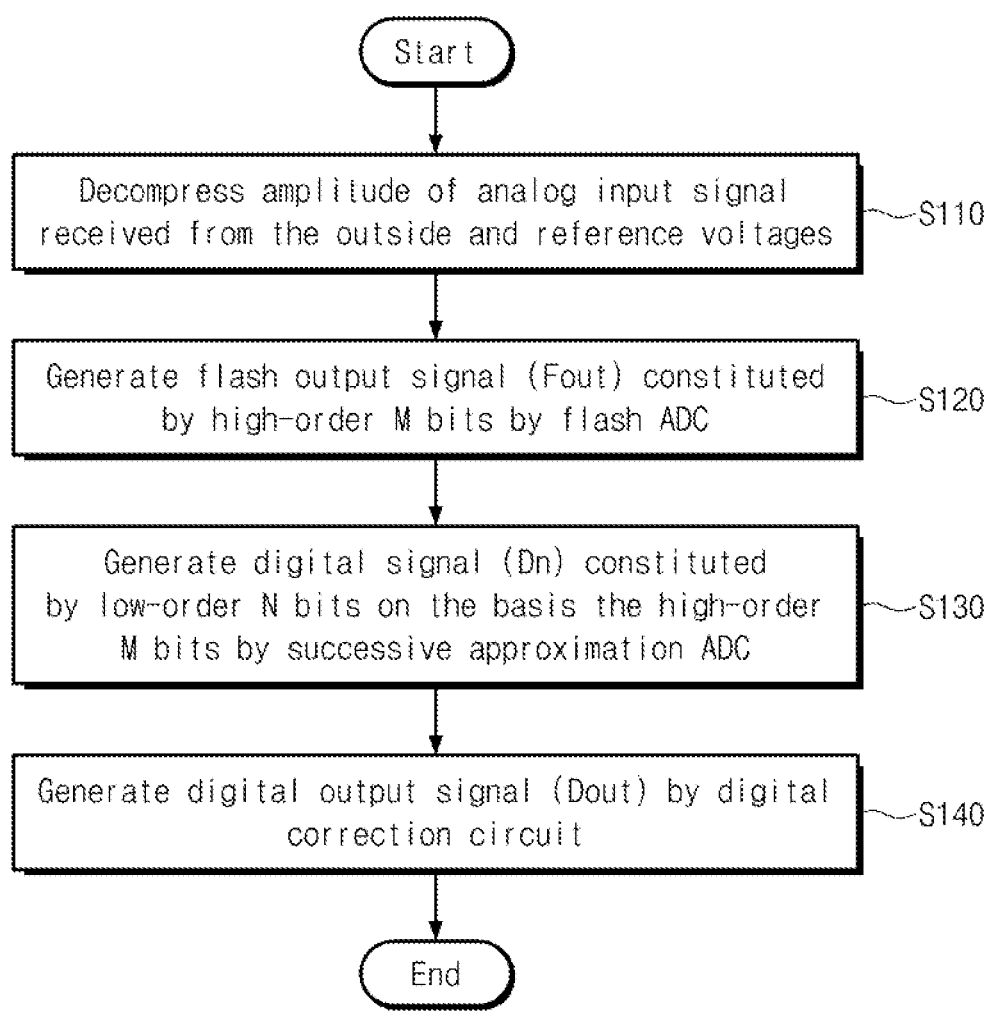
FIG. 5 is a flow chart illustrating a process that an analog input signal of FIG. 1 is converted into a digital signal.

FIG. 5 is a flow chart illustrating a process that an analog input signal of FIG. 1 is converted into a digital signal.

In step S110, the analog input signal Vin received from the outside and the first and second reference voltage VREF1 and VREF2 applied from the reference voltage generation circuit 140 are applied to the flash ADC 120 and the successive approximation ADC 130. When the analog input signal Vin and the first and second reference voltages REF1 and REF2 are applied to the flash ADC 120, they are decompressed by the magnitude of $RSCALE^{-1}$ through the decompression part 110 to be applied to the flash ADC 120.

In step S120, high-order M bits are determined in the flash ADC 120. As described with reference to FIG. 3, the flash ADC 120 generates the plurality of comparison voltages VC1~VC7 using the analog input signal Vin' and the first and second reference voltages VREF1' and VREF2' decompressed through the decompression part 110. The flash ADC 120 receives a flash control signal FLC form the controller 150. The flash ADC 120 compares the decompressed analog input signal Vin' with the plurality of comparison voltages VC1~VC7 in response to the received flash control signal FLC. According to a result of comparison, the flash ADC 120 outputs the flash output signal Fout constituted by M bits.

In step S130, the successive approximation ADC 130 receives the first and second reference voltages VREF1 and VREF2 applied from the reference voltage generation circuit 140. The successive approximation ADC 130 generates the new reference signal VREF on the basis of the high-order M bits output from the flash ADC 120. The successive approximation ADC 130 determines values of low-order N bits in response to the successive approximation control signal SC. The successive approximation ADC 130 outputs the digital signal Dn constituted by N bits. In the low-order N bits, logic values of the most significant bit (MSB) through the least significant bit (LSB) are sequentially determined by a successive approximation operation.

In step S140, the digital correction circuit 134 receives the output signal Fout of the flash ADC 120 and the digital signal Dn of the successive approximation ADC 130. The digital correction circuit 134 corrects digital errors of the high-order M bits output from the flash ADC 120 and the low-order N bits output from the successive approximation ADC 130. The digital error circuit 134 generates the digital output signal Dout not including errors.

The mixed mode analog to digital converter 100 can perform a digital conversion using the flash ADC 120 and the successive approximation ADC 130. The flash ADC 120 receives an input voltage decompressed through the decompression part 110. Thus, degradation of the linearity of the flash ADC 120 depending on amplitude of the input signal may be prevented. The successive approximation ADC 130 uses an asynchronous mode. The successive approximation ADC 130 operates a preprocessing amplifier (not shown) occupying most of the power consumption of analog to digital converter only during a defined conversion time and thereby power consumption may be reduced. Thus, the mixed mode analog to digital converter 100 that guarantees a high speed operation characteristic and low power consumption is provided.

What is claimed is:

1. An analog to digital converter (ADC) comprising:
   a reference voltage generation circuit outputting first and second reference voltages;
   a decompression part decompressing an amplitude of each of an analog input signal, the first reference voltage, and the second reference voltage by a decompression magnitude;
   a flash ADC converting the decompressed analog input signal into a first digital signal with reference to the decompressed first and second reference voltages; and
   a successive approximation ADC converting the analog input signal into a second digital signal according to a successive approximation operation with reference to the first digital signal and the first and second reference voltages.

2. The analog to digital converter of claim 1, wherein the flash ADC compares any one voltage level between the decompressed first and second reference voltages with a voltage level of the decompressed analog input signal to determine a value of the first digital signal.

3. The analog to digital converter of claim 2, wherein the first digital signal is constituted by first bits.

4. An analog to digital converter (ADC) comprising:
   a reference voltage generation circuit outputting first and second reference voltages;
   a decompression part decompressing an amplitude of each of an analog input signal and the first and second reference voltages;
   a flash ADC converting the decompressed analog input signal into a first digital signal with reference to the decompressed first and second reference voltages; and
   a successive approximation ADC converting the analog input signal into a second digital signal according to a successive approximation operation with reference to the first digital signal and the first and second reference voltages, wherein the successive approximation ADC generates any voltage level between the first and second reference voltages as a third reference voltage with reference to the first digital signal.

5. The analog to digital converter of claim 4, wherein the successive approximation ADC compares a level of the third reference voltage with a level of the analog input signal to determine a value of the second digital signal.

6. The analog to digital converter of claim 5, wherein the successive approximation ADC generates the second digital signal constituted by second bits with reference to the first bits constituting the first digital signal.

7. The analog to digital converter of claim 6, wherein the first bits are high-order bits as compared with the second bits.

8. The analog to digital converter of claim 7, further comprising a digital correction circuit receiving the first bits and second bits to correct errors.

9. The analog to digital converter of claim 8, wherein the digital correction circuit generates a final digital output signal.

10. The analog to digital converter of claim 1, wherein the successive approximation ADC operates in an asynchronous successive approximation mode.

11. An operation method of an analog to digital converter (ADC) comprising:
    decompressing a voltage amplitude of each of an analog input signal and a reference voltage by a compression magnitude;
    generating a first digital signal constituted by first bits by a flash ADC with reference to the decompressed analog input signal and the decompressed reference voltage;
    generating a second digital signal constituted by second bits on the basis of the first bits, the reference voltage, and the analog input signal by a successive approximation ADC; and
    generating the first and second digital signals as a final digital output signal by a digital correction circuit, wherein the first digital signal is constituted by high-order bits as compared with the second digital signal.

12. The operation method of analog to digital converter of claim 11, wherein when decompressing the voltage amplitude, the voltage amplitude of the analog input signal is decompressed using a gain amplifier and the voltage amplitude of the reference voltage is decompressed by controlling an input value of the reference voltage.

13. The operation method of analog to digital converter of claim 11, wherein the digital correction circuit corrects errors of the first and second digital signals to generate the final digital output signal.

* * * * *